United States Patent [19]

Schweitzer, Jr.

[11] Patent Number: 5,677,623
[45] Date of Patent: Oct. 14, 1997

[54] FAULT POWERED FAULT INDICATOR HAVING TIMED RESET

[76] Inventor: Edmund O. Schweitzer, Jr., 2433 Center St., Northbrook, Ill. 60062

[21] Appl. No.: 629,373

[22] Filed: Apr. 8, 1996

[51] Int. Cl.⁶ ............................................. G01R 19/16
[52] U.S. Cl. ........................... 324/133; 340/659; 340/664
[58] Field of Search .......................... 340/664, 659; 324/133, 127

[56] References Cited

U.S. PATENT DOCUMENTS

| | | | |
|---|---|---|---|
| 4,794,331 | 12/1988 | Schweitzer, Jr. | 324/133 |
| 4,794,332 | 12/1988 | Schweitzer, Jr. | 324/133 |
| 4,795,982 | 1/1989 | Schweitzer, Jr. | 324/508 |
| 4,904,932 | 2/1990 | Schweitzer, Jr. | 324/133 |
| 5,070,301 | 12/1991 | Schweitzer, Jr. | 324/509 |
| 5,111,189 | 5/1992 | Yeh | 324/133 |
| 5,153,565 | 10/1992 | Schweitzer, Jr. | 340/650 |
| 5,220,311 | 6/1993 | Schweitzer, Jr. | 340/650 |
| 5,274,324 | 12/1993 | Schweitzer, Jr. | 324/96 |
| 5,420,502 | 5/1995 | Schweitzer, Jr. | 324/96 |

*Primary Examiner*—Ernest F. Karlsen
*Assistant Examiner*—Jose M. Solis
*Attorney, Agent, or Firm*—Lockwood, Alex, FitzGibbon & Cummings

[57] ABSTRACT

A fault indicator is described having a winding disposed on a magnetic pole assembly. The winding delivers energy from a monitored conductor to circuitry of the fault indicator. A series-connected threshold device, such as a four layer bilateral diode or a zener diode, precludes a capacitor from charging during normal current flow in the monitored conductor. The series-connected threshold device, however, breaks down when a fault current flows in the monitored conductor. After break down, the fault current charges the capacitor. A shunt-connected threshold device, such as a zener diode, limits the voltage developed across the capacitor. After its charging phase, the capacitor drives a multivibrator which actuates an LCD, displaying the occurrence of the fault current to an operator. A series-connected threshold device shuts the LCD off when the voltage across the capacitor drops to a sufficiently low level. The arrangement of these electrical components allows the operator to accurately define the duration of time in which the LCD displays the occurrence of the fault current in the monitored conductor.

16 Claims, 3 Drawing Sheets

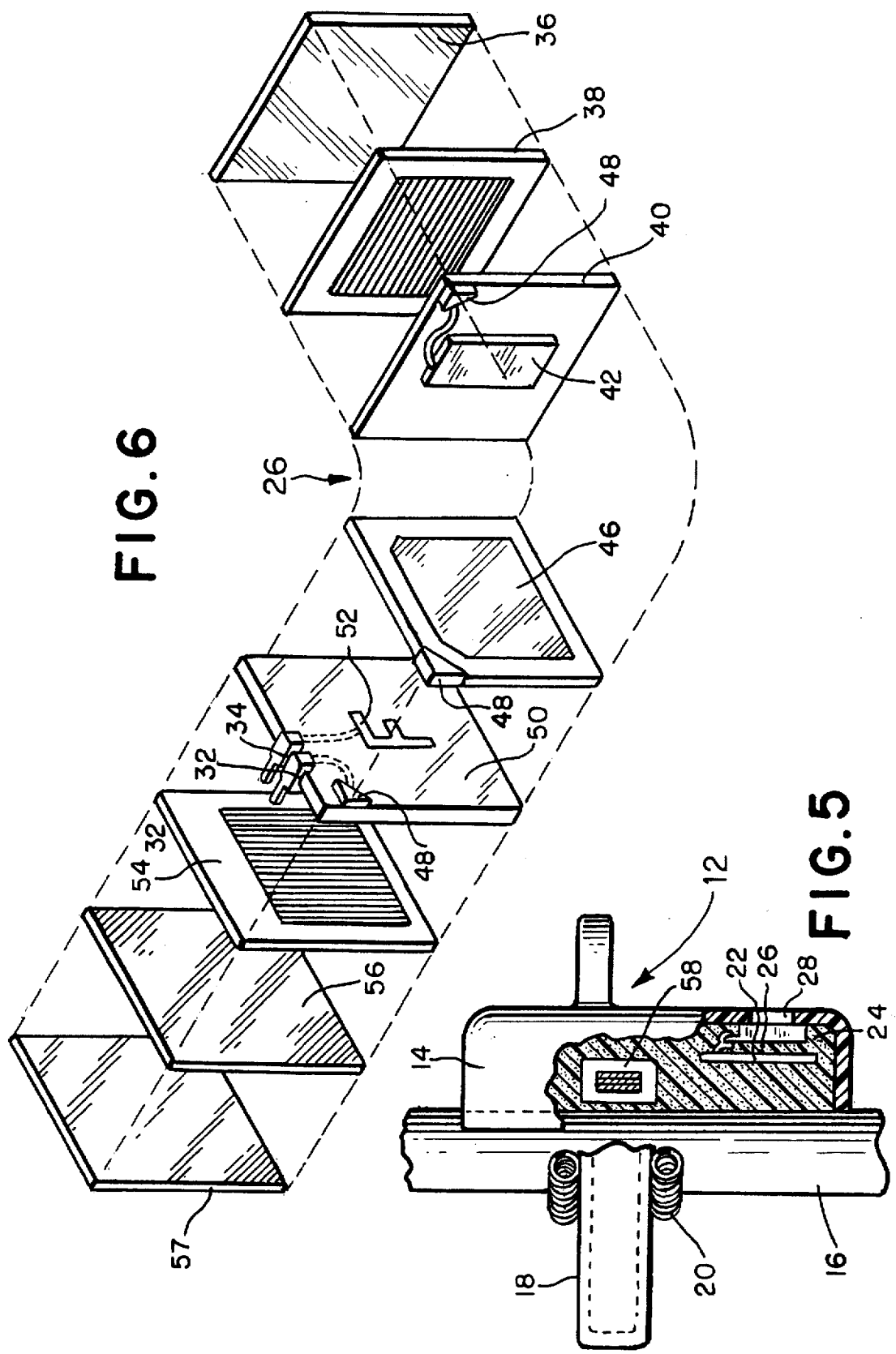

FAULT POWERED FAULT INDICATOR HAVING TIMED RESET

BACKGROUND OF THE INVENTION

The present invention is generally directed to circuit monitoring devices, and more particularly, to an improved fault-powered fault indicator having a timed reset independent of residual line current.

Various types of fault indicators have been constructed for detecting electrical faults in power distribution systems, including clamp-on type fault indicators, which mount on a cable of the system, and test-point mounted fault indicators, which mount on a test point incorporated in a system component.

Previous clamp-on type fault indicators typically derived their operating power from the magnetic field induced around the cable by normal current flow in the cable. Upon occurrence of a fault current in the cable, these fault indicators would detect the fault current typically by closure of a reed switch in magnetic communication with the cable, and indicate the fault by conditioning a mechanical flag or other indicating device. The fault indicators would reset either automatically upon resumption of current flow in the conductor, or upon an operator actuating a reset circuit.

These prior fault indicators, while providing generally satisfactory performance in many applications, were under certain conditions undesirably subject to premature reset by residual currents present on the monitored conductor.

The present invention overcomes the drawbacks of the prior fault indicators by providing a cable-mounted fault indicator which derives its operating power from the magnetic field induced by a fault current in the cable, and not from normal, non-fault currents in the cable. Following the occurrence of a fault, the fault indicator remains in a fault indicating status for a predetermined period of time, regardless of the resumption of normal non-fault current flow in the cable.

Accordingly, it is a general object of the present invention to provide a new and improved fault indicator.

It is a more specific object of the present invention to provide an improved fault indicator which derives its operating power from the magnetic field associated with a fault current in a monitored conductor.

It is a still more specific object of the present invention to provide a fault current powered fault indicator which provides a timed reset independent of normal current flow in a monitored conductor.

SUMMARY OF THE INVENTION

The invention is directed to a fault indicator for indicating the occurrence of a fault current in a monitored electrical conductor, which fault indicator includes a housing and status indicating means within the housing for indication of either a fault state or a reset state of the fault indicator. First circuit means within the housing derive operating power for the fault indicator from the magnetic field associated with a fault current in the monitored conductor. Second circuit means operable from operating power derived by said first circuit means condition said status indicating means to a fault-indicating state upon the occurrence of a fault current. Upon expiration of a predetermined period of time after the occurrence of the fault current, third circuit means operable from operating power derived by said first circuit means condition the status indicating means back to a reset-indicating state.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 5 is a cross-sectional view of the fault indicator of FIGS. 1, 3 and 4 taken along line 5—5 of FIG. 4.

FIG. 6 is an enlarged exploded perspective view showing the principal elements of the liquid crystal display component utilized in the fault indicator of FIGS. 1-5.

DESCRIPTION OF THE PREFERRED EMBODIMENT

Figure 1:
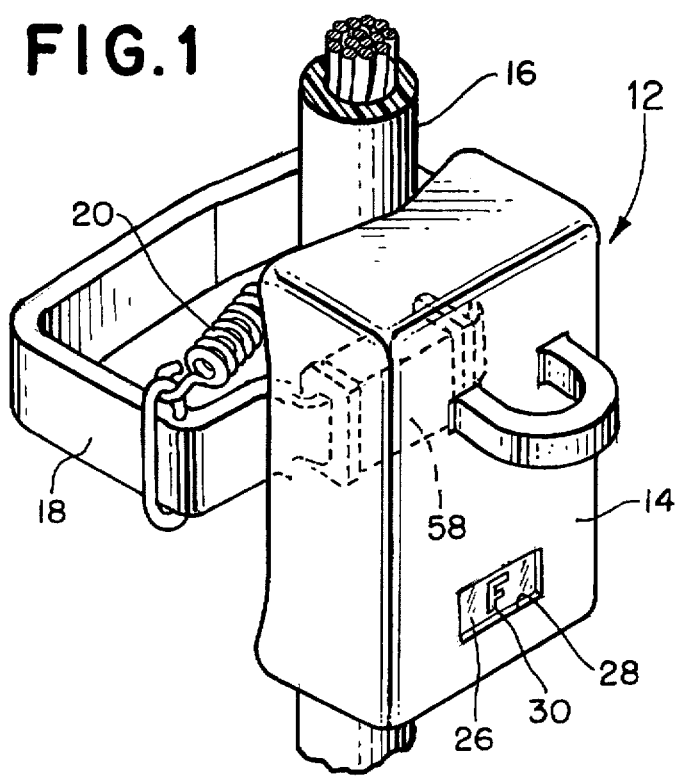
FIG. 1 is a perspective view of a clamp-on type fault current-powered fault indicator constructed in accordance with the invention installed on a cable within a power distribution system.

Referring to the drawings, and particularly to FIGS. 1-5, a cable-mounted fault current-actuated fault indicator 12 constructed in accordance with the invention may include a generally rectangular housing 14 secured to a conventional cable 16 including a monitored electrical conductor 17 by means of a resilient magnetic pole assembly 18 which encircles the cable. The magnetic pole assembly is held in a closed position by a spring 20 which secures cable 16 against a V-shaped recess in the housing.

Figure 2A:
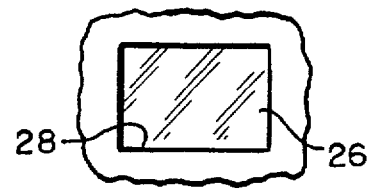
FIG. 2A is a partial front elevational view of the display window of the fault indicator of FIG. 1 showing a reset indication of the fault indicator.
Figure 2B:
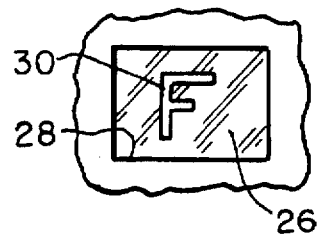
FIG. 2B is a partial front elevational view similar to FIG. 2A showing a fault indication of the fault indicator.
Figure 3:
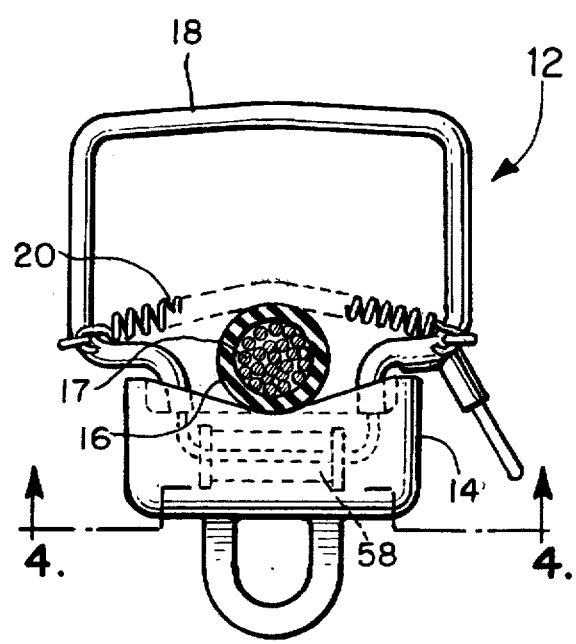
FIG. 3 is a top plan view of the fault indicator of FIG. 1 showing the engagement between the fault indicator and the cable.
Figure 4:
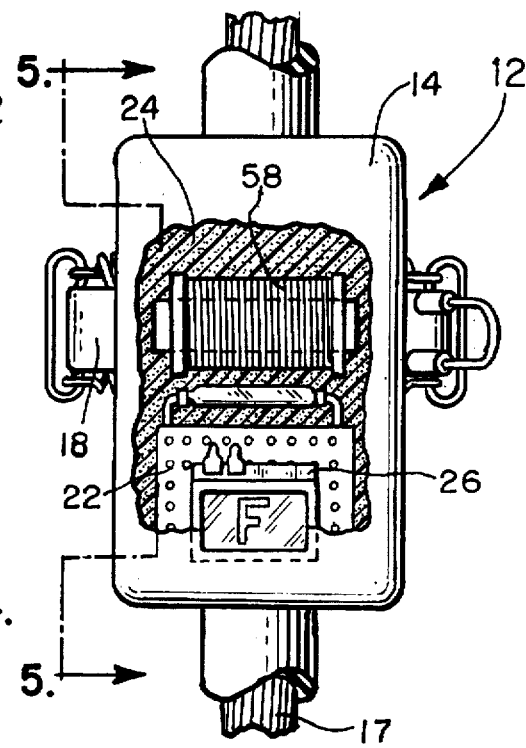
FIG. 4 is a cross-sectional view of the fault indicator of FIGS. 1 and 3 taken along line 4—4 of FIG. 3.

Within housing 14, fault indicator 12 includes circuit board 22 (FIG. 4) on which the principal components of the indicator are mounted. A layer of potting compound 24 seals the circuit board within the housing. A circuit status is indicated by a high impedance liquid crystal display (LCD) component 26, which is mounted on the circuit board. As shown in FIGS. 2A-2B, fault indicator 12 provides a readily comprehended display of circuit status: indicating a blank while in the reset status condition (see FIG. 2A) and indicating an "F" while in the fault status condition (see FIG. 2B). Component 26 is positioned behind a viewing window 28 such that the "F" display of the component can be readily observed from the exterior of the housing when the indicator is in the fault status condition.

Internally, as shown in FIG. 6, the liquid crystal display component 26, which may be conventional in structure and operation, is capable of producing an display 30 (FIG. 2B) to indicate a fault occurrence. Electrical connections are made with the component by means of two electrical terminals 32 and 34 arranged along the top edge of the component. The liquid crystal display component 26 generally includes a transparent face plate 36, a front polarizer 38, a glass plate 40 on which a transparent backplane electrode 42 is provided, a layer 46 of twisted pneumatic liquid crystal material, electrically conductive edge contacts 48, a glass plate 50 on which a transparent indicator segment electrode 52 is contained, a rear polarizer 54 aligned at right angles to front polarizer 38, a reflector 56 and a rear supporting plate 57.

The "F" display is conventionally formed by the pneumatic liquid crystal layer 46, which in the absence of an applied electrical field has the property of rotating the polarization of light as it passes through the molecular layers of the layer. In particular, as randomly polarized light enters the display component through face plate 36, only horizontally polarized light passes through front polarizer 38. In the absence of an applied electric field, the polarization of this polarized light is rotated 90 degrees as it passes through the pneumatic crystal layer 46 and reaches rear polarizer 54. Since the polarization of the light has been rotated the light is able to pass through this polarizer onto the reflective layer 56, wherein it is reflected back through polarizer 54, rotated by liquid crystal layer 46 passed through polarizer 38 to face plate 36 and window 28. Thus, in the absence of an applied electric field light entering face plate 36 is passed through the device and reflected back out, presenting a blank or white-colored appearance to the observer.

By applying an electric field between transparent indicator segment electrode 52 and transparent backplane electrode 42 the liquid crystal layer in its intervening portions is caused to pass incoming light without rotating its polarization, thereby selectively blocking the transmission and reflection of light to the viewing window 28 in the "F" pattern and causing this character to be displayed to a viewer as a darkened letter.

An electric field is established to generate the "F" display by applying a signal to contacts 32 and 34, which connect to respective ones of display electrodes 42 and 52. Consequently, by applying a signal between contacts 32 and 34 the "F" display is caused to appear at face plate 36.

Figure 7:
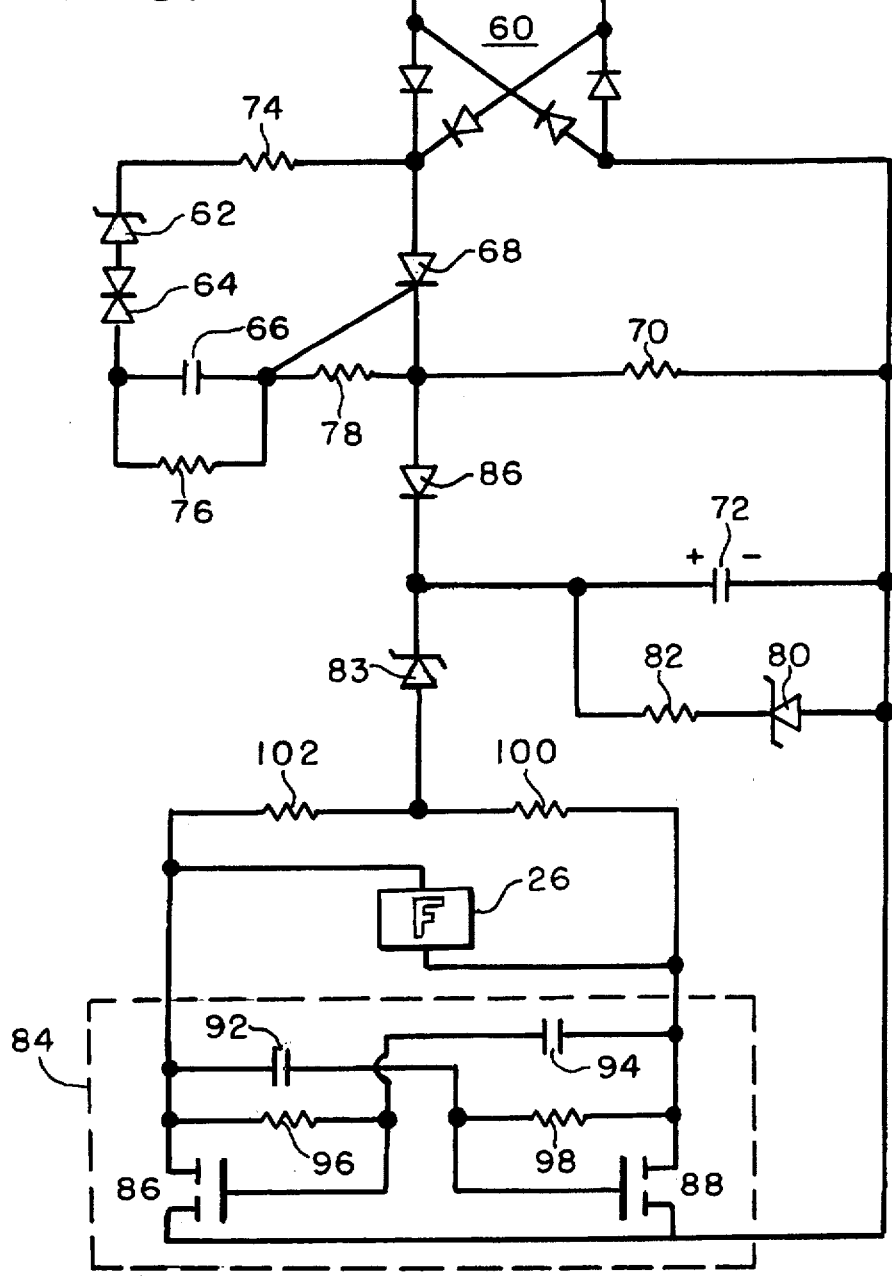
FIG. 7 is an electrical schematic diagram of the fault indicator of FIGS. 1-5.

The necessary signals for actuating the "F" display are provided by circuitry of fault indicator 12. Referring to FIG. 7, operating power for the circuitry is obtained by means of a winding 58 disposed on magnetic pole assembly 18 within housing 14. In the presence of alternating current in the monitored conductor an alternating current is induced in winding 58. Winding 58 is designed to supply the circuitry of fault indicator 12 with sufficient energy upon the occurrence of a fault current in monitored conductor 17 to drive liquid crystal display component 26 to a fault-indicating state for a desired period, after which that device returns to a normal reset state. In practice, the winding is designed to resonate with a one hundred microfarad capacitor at sixty hertz.

The alternating current induced in winding 58 is applied to the input terminals of a bridge rectifier network 60, wherein it is rectified to produce a pulsating unidirectional current at the output terminals of the network. When the rectified current derives from a normal current (as opposed to a fault current) in the monitored conductor 17, threshold elements in the form of a series-connected reverse-biased zener diode 62 and a four layer bilateral diode 64 prevent the rectified current from charging a first charge storage means in the form of a capacitor 66. The breakdown voltage of zener diode 62 and the threshold voltage of bilateral diode 64 combined, typically 20 volts, are sufficiently high to prevent the conduction of these devices under normal current conditions in the monitored cable.

Under normal current conditions in the monitored conductor 17, the series-connected zener diode 64 and bilateral diode 66 also prevent current flow to the gate electrode of a silicon-controlled rectifier (SCR) 68, thereby preventing the SCR from transitioning to a conductive state. A resistor 70 bypasses leakage current through SCR 68 to prevent the undesirable build-up over time of a charge on a second charge storage means in the form of a capacitor 72 during normal current conditions in the monitored conductor.

Upon occurrence of a fault current in the monitored conductor 17, the voltage across zener diode 62 and bilateral diode 64 exceeds the breakdown and threshold voltages of the respective devices to render both components conductive. For a typical application, 400 Amperes or more will trigger these series-connected threshold devices. Once these devices are triggered, capacitor 66 charges. A resistor 74 limits current flow through zener diode 62 and bilateral diode 64 to prevent damage to these devices from excessive current flow.

Once capacitor 66 charges, a pulse of current is caused to flow through the gate electrode of SCR 68, rendering that device conductive. A resistor 78 is connected between the cathode and the gate electrodes of SCR 68 as a drain impedance for the SCR. Resistor 76 serves to bleed off any charge in capacitor 66 after the fault current has ceased. While SCR 68 is conductive, the rectified current induced by the fault current in the monitored conductor passes through that device and a diode 86 to charge capacitor 72 until the voltage across that capacitor reaches a predetermined value, determined by the breakdown voltage of a voltage threshold element in the form of reverse-biased zener diode 80. At that time, zener diode 80 becomes conductive and limits the voltage across the capacitor. A resistor 82 limits current flow through zener diode 80 to prevent damage to the device. Diode 86 prevents capacitor 72 from discharging through SCR 68 and its associated circuitry.

In practice, SCR 86 may be conductive for two to six microseconds, which is sufficient to charge capacitor 72 to a point where the voltage across that element is equal in magnitude to the breakdown voltage of zener diode 80. Both the capacitance of capacitor 72 and the breakdown voltage of zener diode 80 are predetermined. Thus, the capacitor acquires and will deliver a known amount of energy to LCD 26 during the timed reset period in which that component visibly indicates the occurrence of a fault current in monitored conductor 17.

After occurrence of the fault current, capacitor 72 supplies current to a multivibrator 84 through a zener diode 83. Multivibrator 84 drives the liquid crystal display component 26 to display the "F" fault-indicating symbol within housing 14. Upon discharge of capacitor 72 to a point where the voltage across that element is lower than the breakdown voltage level of zener diode 83, typically six volts, LCD 26 no longer displays the "F" symbol. Zener diode 83 thus prevents the display from "greying out" as the voltage across capacitor 72 falls below the operating level of the LCD.

Since the maximum stored charge of capacitor 72 is predetermined, and since multivibrator 84 drives LCD 26 until the voltage across capacitor 72 falls below the predetermined threshold voltage set by zener diode 83, a timed reset of the fault indicator from the fault-indicating state is achieved.

A forward-biased isolation diode 86 prevents any undesirable leakage current from the stored charged on capacitor 72 to capacitor 66 and the other charging components, thereby ensuring that practically all of the stored charge on capacitor 72 which makes the voltage across that element larger than the breakdown voltage of zener diode 83 is used to power LCD 26 and actuate the "F" display within housing 14.

Multivibrator 84 improves the life expectancy of LCD 26 by periodically reversing the polarity of the voltage across that component. In particular, multivibrator 84 includes two Field Effect Transistors (FETs) 86 and 88, only one of which is conductive at any one time. This alternation of conductivity between FETs 86 and 88 occurs in a manner well known to the art because of the interconnection of capacitors 92 and 94 and resistors 96 and 98.

The periodic alternation of conductivity between FETs 86 and 88 has the effect of periodically reversing the voltage across LCD 26. More specifically, during the first half of the multivibrator operating cycle, FET 86 is conductive and FET 88 is non-conductive. The positive terminal of capacitor 72 is connected through a very high-impedance resistor 100, typically 1000 Megaohms, to terminal 32 of LCD 26. The negative terminal of capacitor 72 is tied directly to terminal 34 of LCD 26. Thus, terminal 32 of the LCD is at a higher electrical potential than terminal 34.

Alternatively, during the second half of the multivibrator cycle, FET 88 is conductive and FET 86 is non-conductive. The positive terminal of capacitor 72 is connected through a very high-impedance resistor 102, typically 1000 Megaohms, to terminal 34 of LCD 26. The negative terminal of capacitor 72 is tied directly to terminal 32 of LCD 26. Therefore, terminal 34 of LCD 26 is at a higher electrical potential than terminal 34, the opposite of the first half cycle.

While a particular embodiment of the invention has been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A fault indicator for indicating an occurrence of a fault current in a monitored electrical conductor, comprising:

a housing;

status indicating means within said housing for indicating a status of said fault indicator, said status indicating means having a reset-indicating state and a fault-indicating state;

first circuit means for deriving operating power only from said fault current in said conductor;

second circuit means operable from the operating power derived by said first circuit means for conditioning said status indicating means to said fault-indicating state in response to said occurrence of said fault current in said conductor; and third circuit means for conditioning said status indicating means to said reset-indicating state upon expiration of a predetermined period of time after said occurrence of said fault current in said conductor.

2. A fault indicator as defined in claim 1 wherein said second circuit means include a capacitor for supplying an operating current to said status indicating means during said predetermined period of time after said occurrence of said fault current in said conductor.

3. A fault indicator as defined in claim 2 wherein said second circuit means include a voltage limiting element for said capacitor.

4. A fault indicator as defined in claim 3 wherein said voltage limiting element comprises a zener diode.

5. A fault indicator as defined in claim 2 wherein said second circuit means include a multivibrator for periodically reversing a direction of said operating current applied to said status indicating means during said predetermined period of time after said occurrence of said fault current in said conductor.

6. A fault indicator as defined in claim 2 wherein said first circuit means include at least one threshold device which is conductive during said occurrence of said fault current in said conductor and non-conductive during an occurrence of a normal non-fault current in said conductor.

7. A fault indicator as defined in claim 6 wherein said at least one threshold device comprises a zener diode.

8. A fault indicator as defined in claim 6 wherein said at least one threshold device comprises a bilateral diode.

9. A fault indicator as defined in claim 8 wherein said at least one threshold device further comprises a zener diode.

10. A fault indicator as defined in claim 1 wherein said status indicating means comprises a high impedance display device.

11. A fault indicator as defined in claim 10 wherein said display device includes at least a pair of display electrodes disposed in operative association with a layer of voltage-responsive light controlling material.

12. A fault indicator as defined in claim 11 wherein said display device is conditioned to said reset-indicating state in an absence of an actuating signal applied to said electrodes by said second circuit means.

13. A fault indicator as defined in claim 11 wherein said second circuit means condition said display device to said fault-indicating state by applying an actuating signal to said electrodes of said display device.

14. A fault indicator as defined in claim 11 wherein said second circuit means include a multivibrator for periodically reversing a polarity of a voltage across said electrodes of said display device during said predetermined period of time after said occurrence of said fault current in said conductor.

15. A fault indicator as defined in claim 12 wherein said second circuit means include a multivibrator for periodically reversing a polarity of a voltage across said electrodes of said display device during said predetermined period of time after said occurrence of said fault current in said conductor.

16. A fault indicator as defined in claim 13 wherein said second circuit means include a multivibrator for periodically reversing a polarity of a voltage across said electrodes of said display device during said predetermined period of time after said occurrence of said fault current in said conductor.

* * * * *